United States Patent
Kiel

(10) Patent No.: US 11,094,618 B2
(45) Date of Patent: Aug. 17, 2021

(54) POWER SWITCHING MODULAR ELEMENT AND DISMOUNTABLE ASSEMBLY OF A PLURALITY OF MODULAR ELEMENTS

(71) Applicant: INSTITUT VEDECOM, Versailles (FR)

(72) Inventor: Friedbald Kiel, Fontainebleau (FR)

(73) Assignee: INSTITUT VEDECOM, Versailles (FR)

( * ) Notice: Subject to any disclaimer, the term of this patent is extended or adjusted under 35 U.S.C. 154(b) by 0 days.

(21) Appl. No.: 17/043,558

(22) PCT Filed: Mar. 29, 2019

(86) PCT No.: PCT/FR2019/050736
§ 371 (c)(1),
(2) Date: Sep. 29, 2020

(87) PCT Pub. No.: WO2019/186080
PCT Pub. Date: Oct. 3, 2019

(65) Prior Publication Data
US 2021/0057315 A1 Feb. 25, 2021

(30) Foreign Application Priority Data
Mar. 30, 2018 (FR) ...................................... 1852816

(51) Int. Cl.
*H01L 23/495* (2006.01)
*H01L 23/373* (2006.01)
(Continued)

(52) U.S. Cl.
CPC .... *H01L 23/49575* (2013.01); *H01L 23/3735* (2013.01); *H01L 23/473* (2013.01);
(Continued)

(58) Field of Classification Search
CPC ......... H01L 23/49575; H01L 23/49517; H01L 24/33; H01L 23/473; H01L 25/072;
(Continued)

(56) References Cited

U.S. PATENT DOCUMENTS 8,040,708 B2 * 10/2011 Sato ........................ H01L 24/73
363/147
8,633,550 B2 * 1/2014 Uno ........................ H01L 24/37
257/401

(Continued)

FOREIGN PATENT DOCUMENTS

EP 3190694 A1 7/2017

OTHER PUBLICATIONS

International Search Report for PCT/FR2019/050736 dated Jul. 2, 2019.
Written Opinion for PCT/FR2019/050736 dated Jul. 2, 2019.

*Primary Examiner* — Alexander O Williams
(74) *Attorney, Agent, or Firm* — Sandberg Phoenix & von Gontard, P C

(57) ABSTRACT

The invention relates to a modular element (2) comprising a stratification of first and second electroconductive plates (PH2, PB2) which are separated by an intermediate dielectric layer (CD2) and at least one electronic power switching chip (CP1, CP2) which is implanted between the first and second plates, the chip having a upper face comprising a first power electrode and a switching control electrode and a lower face comprising a second power electrode, and the first and second power electrodes being in electrical continuity respectively with the first and second plates. According to the invention, the modular element comprises a plurality of openings (OG2, OA2, OB2, OC2, OD2) extending into the stratification from outer surfaces of the first and second plates and perpendicularly to said outer surfaces, the plurality of openings comprising at least one first opening (Continued)

(OG2) communicating with the switching control electrode and at least one second opening (OA2, OB2) passing through the entire stratification, the first and second openings each comprising a dielectric layer (DE2) and an electroconductive layer (CI2), and the electroconductive layer of the first opening being electrically connected to the switching control electrode.

10 Claims, 3 Drawing Sheets

(51) Int. Cl.
  *H01L 23/473* (2006.01)
  *H01L 23/00* (2006.01)
  *H01L 25/07* (2006.01)
(52) U.S. Cl.
  CPC ........ *H01L 23/49517* (2013.01); *H01L 24/33* (2013.01); *H01L 25/072* (2013.01)
(58) Field of Classification Search
  CPC . H01L 23/3735; H01L 23/495; H01L 23/373; H01L 25/07; H01L 23/00; H01L 29/42344; H01L 29/792; H01L 29/66833; H01L 21/062238; H01L 21/66833; H01L 29/423; H01L 29/66; H01L 21/02; H01L 21/762
  USPC ........................................................ 257/676
  See application file for complete search history.

(56) References Cited

U.S. PATENT DOCUMENTS

| | | | |
|---|---|---|---|
| 9,054,094 B2* | 6/2015 | Anthony | H01L 23/49827 |
| 2009/0085444 A1* | 4/2009 | Alvarez Icaza Rivera | H01L 41/1132 310/365 |
| 2013/0020694 A1 | 1/2013 | Liang et al. | |
| 2013/0052523 A1* | 2/2013 | Yamada | B60L 50/64 429/199 |
| 2013/0119525 A1* | 5/2013 | Tsuyuno | H01L 24/40 257/675 |
| 2018/0331362 A1* | 11/2018 | Niwata | H01M 4/505 |
| 2019/0027783 A1* | 1/2019 | Matsushita | H01M 4/386 |
| 2020/0013755 A1* | 1/2020 | Kiel | H02M 7/003 |

* cited by examiner

POWER SWITCHING MODULAR ELEMENT AND DISMOUNTABLE ASSEMBLY OF A PLURALITY OF MODULAR ELEMENTS

CROSS-REFERENCE TO RELATED APPLICATIONS

This application is the US National Stage under 35 USC § 371 of International Application No. PCT/FR2019/050736, filed 29 Mar. 2019 which claims the priority of the French application 1852816 filed on 30 Mar. 2018, the content (text, drawings and claims) of both being incorporated herein by reference.

BACKGROUND

The invention relates in a general manner to the field of power electronics. More particularly, the invention relates to power switching modular elements, and to dismountable (disassemblable) assemblies of such modular elements.

The power switching modules form the building blocks required for constructing electronic power devices. The power switching modules can be associated in order to form switching bridges, or associated in parallel in order to pass the desired current. The switching bridge branches, made up of two electronic power switches, are elementary power modules that are very widespread for implementing electronic power devices such as inverters and power converters.

The present-day needs are promoting a search for increased modularity, in particular in order to allow for different circuits to be achieved, from the simplest to the most complex, starting from the same modular brick, to increase standardization, and to reduce costs. Furthermore, a more advanced modularity makes it possible to reduce the scrap value of the production, given the possibility of testing the functionality at the level of the elementary bricks.

The compactness of the power switching modules is an essential feature, not only for reducing material costs, but also for achieving the best possible design compromises. Indeed, the compactness promotes the reduction of resistive, inductive, and capacitive parasitic elements. Reducing the parasitic inductances, in particular in the power busbars, is important in order to protect the circuits from possibly destructive overvoltages, improve the control of the electromagnetic radiation, reduce the heat generated, and increase the switching speed.

The compactness of the architectures is also required for judicious use of new power semi-conductors, currently, such as, silicon carbide (SiC) and gallium nitride (GaN) and, soon, diamond. Indeed, the greater current densities and switching frequencies brought about by the new power semi-conductors promote greater compactness.

The 3D architectures are of some interest with regard to increasing the compactness of modules and electronic power devices. However, the cooling constraints are critical in these architectures, and efficient solutions have to be implemented here. Extraction of the dissipated energy as close as possible to the power chips is necessary in order to keep the temperatures of the components below critical values, and to guarantee thermal equilibrium. Double-face cooling of the power chips is desirable. Cooling devices that operate by means of a heat-transfer fluid and/or use heat-pipes may be required.

The architectures that facilitate the implementation of SiP (System in Package) type devices are of interest due to the benefit they bring in terms of integration level and compactness. A power switching module architecture which allows for flexibility in the spatial location of electrodes is of interest for implementing SiP devices.

The disassemblable nature of the architectures, down to the most elementary possible brick, is a significant advantage for reparability. The technology known as "press-pack," in which the electrical contacts are ensured by means of mechanical pressure or clamping means, makes it possible to achieve testable and replaceable elementary bricks, while bringing about an improvement in the reliability in applications having extreme thermal cycles, by eliminating welding.

It now appears to be desirable to propose a power switching module having a new elementary switching brick architecture which is suitable for disassemblable assemblies of the parallel and/or stacked type, the new SiC and GaN power semi-conductors, in particular GaN transistors having a lateral structure, as well as 3D and "press-pack" technologies, and economical mass production based on printed circuit production technologies.

SUMMARY

According to a first aspect, a power switching modular element comprises a lamination of first and second electroconductive plates which are separated by an intermediate dielectric layer, and at least one electronic power switching chip which is implanted between the first and second electroconductive plates, the electronic power switching chip having an upper face comprising a first power electrode and a switching control electrode, and a lower face comprising a second power electrode, and the first and second power electrodes being in electrical continuity with the first and second electroconductive plates, respectively. The power switching modular element comprises a plurality of openings extending into the lamination from outer surfaces of the first and second electroconductive plates perpendicularly to the outer surfaces, the plurality of openings comprising at least one first opening that communicates with the switching control electrode, and at least one second opening that passes through the entire lamination, the first and second openings each comprising a dielectric layer and an electroconductive layer, and the electroconductive layer of the first opening being electrically connected to the switching control electrode.

According to a particular feature, the openings are distributed having a fixed spacing pitch.

According to another particular feature, the power switching modular element comprises two electronic power switching chips which are mounted in parallel, the electronic power switching chips being implanted side-by-side and having the switching control electrodes thereof arranged facing each other, and comprising a first opening that communicates with the switching control electrodes and having an electroconductive layer that is electrically connected to the switching control electrodes.

According to yet another particular feature, the electronic power switching chip is a transistor chip of the vertical type.

It will be noted that the power switching modular element is well suited to implementing various types of electronic mounting of transistors, such as half-bridge, full bridge, parallel, cascade and other types of mounting, and cascade switching bridges and matrices.

According to another aspect, the disassemblable power switching assembly comprises at least two power switching modular elements as briefly described above, and a plurality of electroconductive assembly pins, in which the electroconductive assembly pins are inserted into the openings of the power switching modular elements and ensure mechanical assembly and electrical connection functions between the power switching modular elements.

According to a particular feature, the two power switching modular elements are arranged top-to-bottom.

According to another particular feature, the disassemblable power switching assembly has, on an outside surface of one of the power switching modular elements, accessibility to a plurality of electrical connections with the switching control electrodes of the electronic power switching chips of the power switching modular elements, the plurality of electrical connections being ensured by means of first openings of the first power switching modular elements and the electroconductive assembly pins.

According to yet another particular feature, the disassemblable power switching assembly comprises a fluid circulation channel formed by a space between the power switching modular elements, the space being determined by a spacing between the power switching modular elements obtained by means of electroconductive assembly pins.

According to yet another particular feature, the disassemblable power switching assembly also comprises at least one assembly and interconnection element that is interposed between the power switching modular elements, the assembly and interconnection element comprising at least one electroconductive bar in which a plurality of through-openings are arranged, the through-openings being distributed by the fixed spacing pitch, and receiving the conductive assembly pins.

According to yet another particular feature, the assembly and interconnection element comprises at least two electroconductive bars, the electroconductive bars being arranged having a specified mutual spacing, so as to form a fluid circulation channel.

DESCRIPTION OF THE FIGURES

Other advantages and features of the present invention will emerge more clearly upon reading the detailed description, below, of a plurality of particular embodiments of the invention, with reference to the accompanying drawings, in which.

DETAILED DESCRIPTION

In the prior art, the encapsulation of the power chips for achieving power switching modules largely makes use of a technology derived from the technology known as IMS (insulated metal substrate). The chip is implanted in a sandwich structure, between two conductive copper plates. Electrolytic deposition of copper and silver sintering techniques are used for the electrical interconnection of the chip. Dielectrics made of epoxy-type resins, reinforced, or not, by fiberglass, or polyimides, are used for the electrical isolation. Laser beam cutting and drilling are frequently used for material removal. Copper tracks and pads for the electrical interconnection are typically obtained by means of wet etching of a copper sheet.

Figure 1:
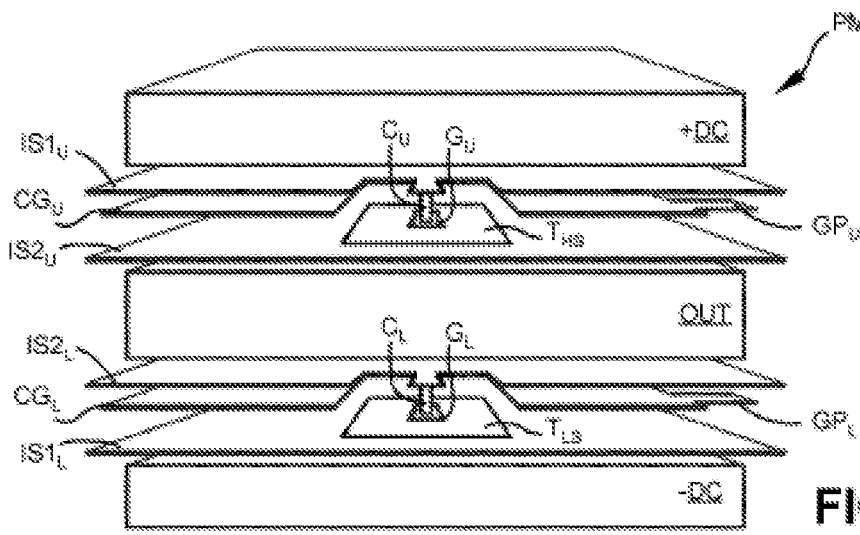
FIG. 1 is a perspective view showing the architecture of a power switching module according to the prior art.

Thus, as shown for example in the prior art of FIG. 1, the 3D stack of a power switching module PM formed of a switching bridge branch comprises transistor chips $T_{HS}$ and $T_{LS}$, busbars +DC and −DC, a central busbar OUT, conducive interconnection sheets $CG_U$ and $CG_L$, and dielectric electrical isolation layers $IS1_U$, $IS2_U$ and $IS1_L$, $IS2_L$. The busbars +DC, −DC and OUT, and the conductive interconnection layers $CG_U$ and $CG_L$ are made of copper, and the dielectric electrical insulation layers $IS1_U$, $IS2_U$ and $IS1_L$, $IS2_L$ are typically made of the above-mentioned materials based on epoxy resins or polyimides.

In this case, the transistor chips $T_{HS}$ and $T_{LS}$ are of the vertical type and comprise source electrodes and drain electrodes (not shown) that are located on the upper and lower faces, respectively, of the chip. The source and drain electrodes are electrically connected to the busbars. The grid electrode $G_U$, $G_L$ of the transistor chip $T_{HS}$, $T_{LS}$ is located on the upper face of the chip. The grid electrodes $G_U$ and $G_L$ are connected to the conductive interconnection sheets $CG_U$ and $CG_L$ by means of conductive tracks $C_U$ and $C_L$ and are in electrical continuity with contact terminals $GP_U$ and $GP_L$, respectively. The dielectric electrical insulation layer $IS1_U$, $IS1_L$ ensures electrical insulation between the busbar +DC, −DC and the conductive interconnection sheet $CG_U$, $CG_L$, respectively. The dielectric electrical insulation layer $IS2_U$, $IS2_L$ ensures electrical insulation between the conductive interconnection sheet $CG_U$, $CG_L$ and the central busbar OUT, respectively.

The electrical connections of the chips $T_{HS}$ and $T_{LS}$ to continuous supply voltages are ensured by the busbars +DC and −DC. The control of the grid electrodes $G_U$ and $G_L$ is ensured by the contact terminals $GP_U$ and $GP_L$. The midpoint of the switching branch PM is available on the central busbar OUT which is dedicated to the alternating voltage.

As can be seen in FIG. 1, the contact terminals $GP_U$ and $GP_L$, for access to the grid electrodes of the chips, are located laterally on the structure, i.e. on the edge thereof. The location of the contact terminals $GP_U$ and $GP_L$ is often a disadvantage. Indeed, additional connection means have to be provided in order to bring the electrical connections as far as the control circuit, which is typically arranged on the upper or lower face of the structure.

Figure 2:
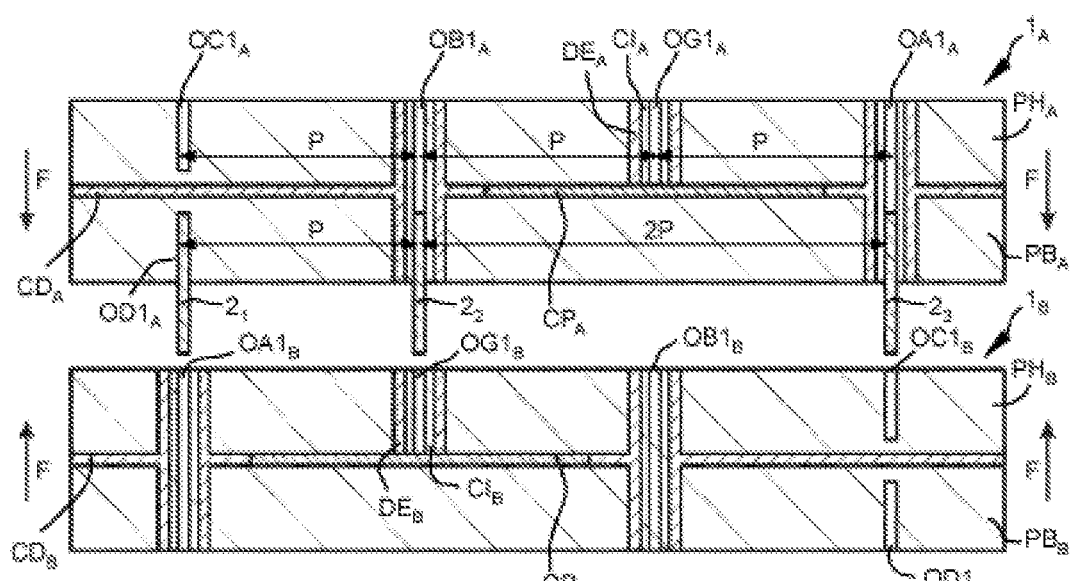
FIG. 2 is a simplified cross-sectional view showing a first embodiment of a power switching modular element.
Figure 3:
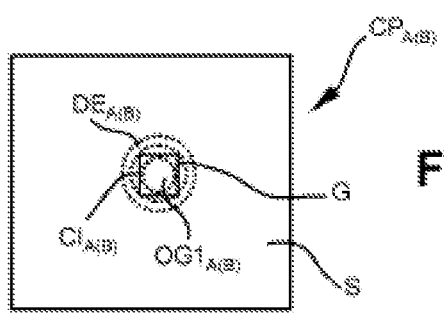
FIG. 3 is a simplified view from below showing, in the power switching modular element of FIG. 2, the positioning of an interconnection opening below a grid electrode of a transistor chip.

With reference to FIGS. 2 and 3, in the following a first particular embodiment 1 of a power switching modular element, as well as an assembly of two modular elements of this kind, will be described.

In the concept of the invention, the power switching modular element is a standardizable component. Advantageously, the power switching modular element is implemented using printed circuit board (PCB) production techniques. The techniques are mastered perfectly, and allow for low-cost production.

Thus, in order to implement the power switching modular elements, it is possible to make use of a combination of different production techniques, including lamination, photolithography, electrodeposition of metal, wet etching, and others. For the purpose of the interconnection of power chips, it is possible to make use of transient liquid phase (TLP) welding, sintering of metal nanoparticle powder, or diffusion welding. Laser cutting and laser drilling are also used and, optionally, other means such as punch die-casting for cutting isolating and copper films or sheets.

FIG. 2 shows two standard power switching modular elements $1_A$ and $1_B$, in a pre-assembly state. The power switching modular elements $1_A$ and $1_B$ are arranged top-to-bottom. Three conductive assembly pins $2_1$, $2_2$ and $2_3$ are also provided, so as to be accommodated in the openings of the power switching modular elements $1_A$ and $1_B$.

In this case, the power switching modular elements $1_A$, $1_B$ each comprise one transistor chip $CP_A$, $CP_B$, respectively. Other embodiments of the modular element may comprise a plurality of transistor chips.

In this embodiment, the transistor chip $CP_A$, $CP_B$, the upper face of which is shown in FIG. 3, is of the vertical type and comprises source electrodes S and drain electrodes (not shown) which form power electrodes that are located on the upper and lower faces, respectively, of the chip. The grid electrode G of the transistor chip $CP_A$, $CP_B$, which forms a switching control electrode, is located on the upper face of the chip, at the center thereof. The transistor chip $CP_A$, $CP_B$ is buried in the structure, in a sandwich formation, between two upper $PH_A$, $PH_B$ and lower $PB_A$, $PB_B$ conductive plates, typically made of copper. An intermediate dielectric layer $CD_A$, $CD_B$ separates the upper $PH_A$, $PH_B$ and lower $PB_A$, $PB_B$ conductive plates, which plates are thus electrically isolated from one another. The transistor chip $CP_A$, $CP_B$ is contained in a recess arranged in the intermediate dielectric layer $CD_A$, $CD_B$ and comprises the upper source face and the lower drain face thereof, which are electrically connected to the upper $PH_A$, $PH_B$ and lower $PB_A$, $PB_B$ conductive plates, respectively.

According to the invention, an opening $OG1_A$, $OG1_B$ is provided in the upper conductive plate $PH_A$, $PH_B$. The opening $OG1_A$, $OG1_B$ extends from the upper face of the upper conductive plate $PH_A$, $PH_B$, as far as the surface of the grid electrode G of the transistor chip $CP_A$, $CP_B$. The opening $OG1_A$, $OG1_B$ is intended for electrical connection, via the upper conductive plate $PH_A$, $PH_B$, of the grid electrode G of the transistor chip $CP_A$, $CP_B$. The opening $OG1_A$, $OG1_B$ is typically formed by means of laser drilling, and comprises a dielectric layer $DE_A$, $DE_B$ and an internal conductive layer $CI_A$, $CI_B$. The dielectric layer $DE_A$, $DE_B$ electrically isolates the upper conductive plate $PH_A$, $PH_B$ and the internal conductive layer $CI_A$, $CI_B$ from one another. The internal conductive layer $CI_A$, $CI_B$ is typically achieved by means of copper metallization. As can be seen in FIG. 3, the internal conductive layer $CI_A$, $CI_B$ is in electrical contact with the grid electrode G. The opening $OG1_A$, $OG1_B$, by way of the internal conductive layer $CI_A$, $CI_B$ thereof, makes it possible to bring the electrical connection to the grid electrode as far as the upper face of the upper conductive plate $PH_A$, $PH_B$.

A plurality of other openings $OA1_A$, $OA1_B$ to $OD1_A$, $OD1_B$ are arranged in the power switching modular elements $1_A$, $1_B$.

As can be seen in FIG. 2, the openings $OA1_A$, $OA1_B$, and $OB1_A$, $OB1_B$ are through-openings, passing through the upper $PH_A$, $PH_B$ and lower $PB_A$, $PB_B$ conductive plates, and the intermediate dielectric layer $CD_A$, $CD_B$. The dielectric $DE_A$, $DE_B$ and internal conductive $CI_A$, $CI_B$ layers are present in the openings $OA1_A$, $OA1_B$, and $OB1_A$, $OB1_B$.

The openings $OC1_A$, $OC1_B$ and $OD1_A$, $OD1_B$ are simple openings, without a dielectric layer, which are formed, for example, by drilling in the upper $PH_A$, $PH_B$ and lower $PB_A$, $PB_B$ conductive plates, respectively. In the modular element $1_A$, $1_B$, the openings $OC1_A$, $OC1_B$ and $OD1_A$, $OD1_B$ are not through-openings, and are aligned on the same axis in the conductive plates $PH_A$, $PH_B$ and $PB_A$, $PB_B$, respectively. The openings $OC1_A$, $OC1_B$ and $OD1_A$, $OD1_B$ remain continuous in the thickness of the conductive plates $PH_A$, $PH_B$, and $PB_A$, $PB_B$, respectively, thus avoiding any risk of a short-circuit between the upper conductive plates $PH_A$, $PH_B$, and $PB_A$, $PB_B$, when the conductive assembly pins $2_1$, $2_3$ are accommodated in the openings.

In a general manner, all of the openings $OG1_A$, $OG1_B$ and $OA1_A$, $OA1_B$ to $OD1_A$, $OD1_B$ are made along axes perpendicular to the upper and lower surface planes of the upper $PH_A$, $PH_B$ and lower $PB_A$, $PB_B$ conductive plates.

As can be seen in FIG. 2, the openings $OG1_A$, $OG1_B$ and $OA1_A$, $OA1_B$ to $OC1_A$, $OC1_B$ are spaced apart by the same spacing pitch P in the upper conductive plate $PH_A$, $PH_B$ in order to allow for the openings to coincide during assembly of the modular elements, in this case the top-to-bottom assembly of the modular elements $1_A$ and $1_B$. The openings in the lower conductive plate $PB_A$, $PB_B$ have the same pitch P, although the opening $OG1_A$, $OG1_B$ is absent in this plate, in this embodiment.

The two modular elements $1_A$ and $1_B$ are assembled by bringing them together (along arrows F). The three pins $2_1$, $2_2$, and $2_3$ are engaged in the openings $OD1_A$ and $OA1_B$, $OB1_A$, and $OG1_B$, and $OA1_A$ and $OC1_B$, respectively. The pins $2_1$, $2_2$ and $2_3$ ensure the mechanical assembly and the electrical connections. Thus, the grid electrodes G of the transistor chips $CP_A$ and $CP_B$ are accessible on the upper face of the upper plate $PH_A$, in the region of the openings $OG1_A$ and $OB1_A$, respectively.

Figure 4:
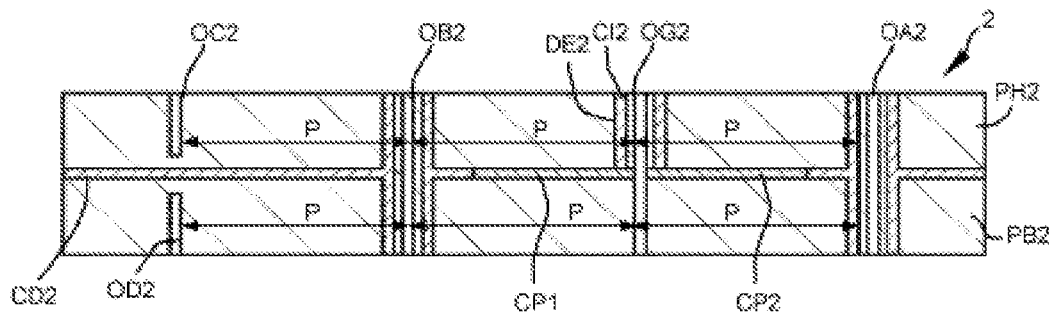
FIG. 4 is a simplified cross-sectional view showing a second embodiment of a power switching modular element.
Figure 5:
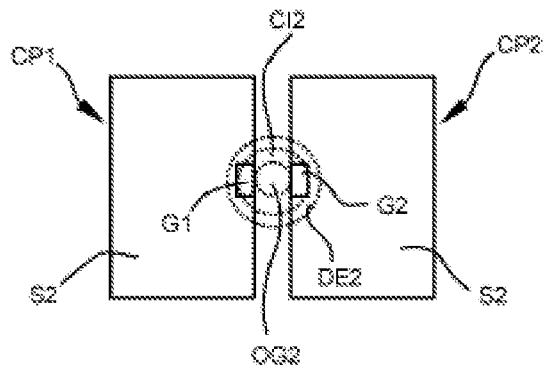
FIG. 5 is a simplified view from below showing, in the power switching modular element of FIG. 4, the positioning of an interconnection opening below grid electrodes of transistor chips.
Figure 6:
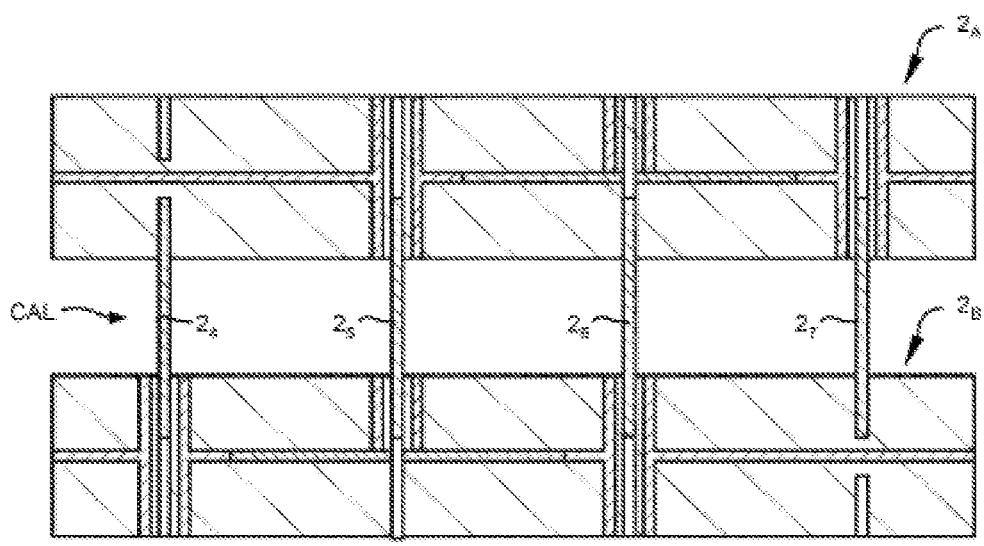
FIG. 6 is a simplified cross-sectional view showing an embodiment of a power switching assembly, comprising a fluid circulation channel.

With reference to FIGS. 4, 5 and 6, a second particular embodiment 2 of a power switching modular element according to the invention, as well as a first assembly of two modular elements of this kind, will now be described.

As shown in FIG. 4, the power switching modular element 2 differs from the modular element 1 essentially by the fact that it comprises two transistor chips CP1 and CP2, also of the vertical type, but having a different connection configuration, and by the grid connection opening OG2.

In a manner analogous to the modular element 1, the transistor chips CP1 and CP2 are buried, in a sandwich manner, between the two upper PH2 and lower PB2 conductive plates, which are typically made of copper. The intermediate dielectric layer CD2 separates the upper PH2 and lower PB2 conductive plates, which plates are thus electrically isolated from one another. The transistor chips CP1 and CP2 are contained in respective recesses which are arranged in the intermediate dielectric layer CD2.

In this embodiment, the transistor chips CP1 and CP2 are mounted in parallel, which indicates that the source, drain and grid electrodes thereof are contacted together, in pairs.

As shown in FIG. 5, the chip CP1, CP2 comprises the source electrode S1, S2 on the upper face thereof, and the grid electrode G1, G2 and the drain electrode (not shown) being located on the lower face of the chip. In the chip CP1, CP2, the grid electrode G1, G2 is not implanted centrally, as in the case of the modular element 1, but on an edge of the chip. The chips CP1 and CP2 are arranged side-by-side, having the grid electrodes G1 and G2 thereof facing each other. The source electrodes S1, S2 and the drain electrodes (not shown) are electrically connected to the upper PH and lower $P_B$ conductive plates, respectively. In this case, the opening OG2 makes it possible to connect all the grid electrodes G1 and G2 and to take the electrical connection as far as the upper face of the upper conductive plate PH2.

As can be seen in FIG. 4, in this case the opening OG2 is a through-opening, passing through the upper PH2 and lower PB2 conductive plates, and the intermediate dielectric layer CD2. A dielectric layer DE2 and a conductive layer CI2 are present in the opening OG2, and cover the opening in the upper conductive plate PH2. As can be seen in FIG. 5, the internal conductive layer CI2 is in electrical contact with the grid electrodes G1 and G2 of the chips CP1 and CP2.

By way of the internal conductive layer CI2 thereof, the opening OG2 thus makes it possible to take the electrical connection of the grid electrodes G1 and G2 as far as the upper face of the upper conductive plate PH2. It will be noted that the metallization of the dielectric layer DE2, which produces the internal conductive layer CI2, does not extend, in the opening OG2, beyond the contact with the grid electrodes G1 and G2, such that there is no short-circuit between the electrodes and the lower conductive plate PB2 to which the drain electrodes are electrically connected. It will be noted that the presence of the opening OG2 in the lower conductive plate PB2 makes it possible, with respect to the modular element 1, to have, in this case, an additional conductive assembly pin, and a regular spacing (pitch P) between the pins.

The other openings OA2, OB2, OC2 and OD2 of the modular element 2 are analogous to the openings OA1, OB1, OC1 and OD1 of the modular element, and will not be described here.

An assembly of two modular elements $2_A$ and $2_B$ having four conductive assembly pins $2_4$ to $2_7$ is shown in FIG. 6. The conductive assembly pins $2_4$ to $2_7$ are longer than the assembly pins $2_1$ to $2_3$ used for the assembly of FIG. 2. In this case, the greater length of the conductive assembly pins $2_4$ to $2_7$ makes it possible to form a fluid circulation channel CAL, while maintaining a spacing between the modular elements $2_A$ and $2_B$. A circulation of a heat-transfer fluid can thus be established through the channel CAL in order to cool the modular elements $2_A$, $2_B$.

Figure 7:
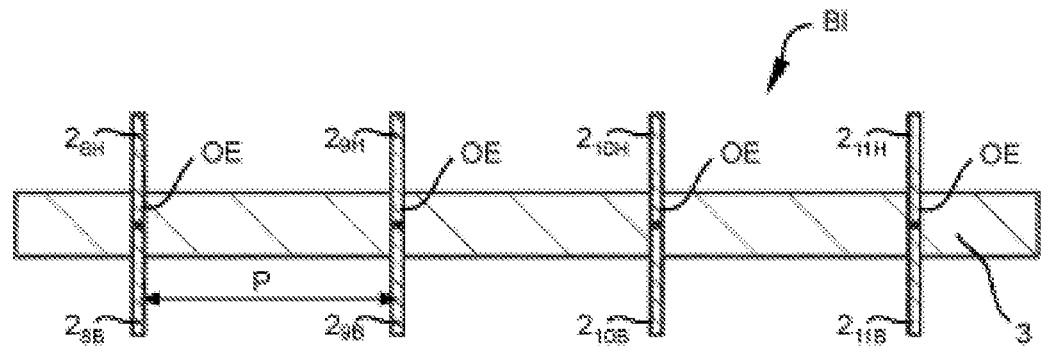
FIG. 7 is a simplified cross-sectional view showing a first embodiment of an assembly and interconnection element that can be used for achieving power switching assemblies.
Figure 8:
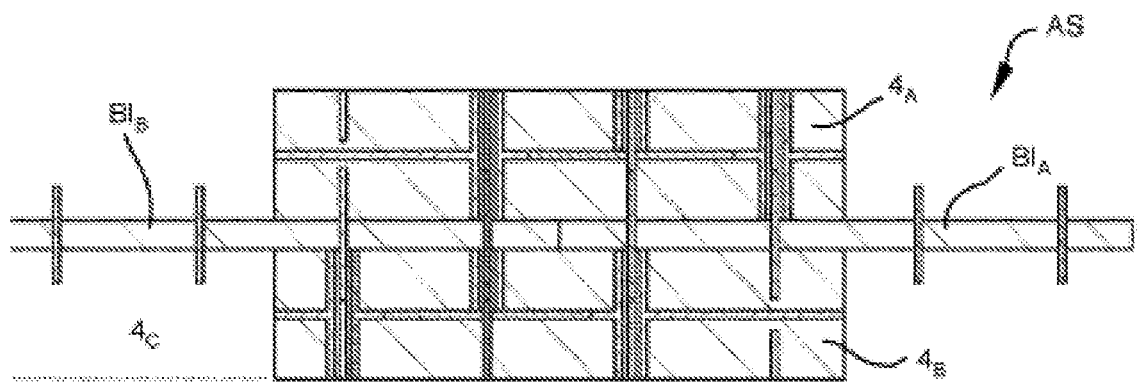
FIG. 8 is a simplified cross-sectional view showing another embodiment of a power switching assembly, comprising assembly and interconnection elements as shown in FIG. 7.

As shown in FIGS. 7 and 8, standard assembly and interconnection elements BI are provided in the invention, and can be used for achieving assemblies AS comprising a large number of modular elements $4_A$, $4_B$, $4_C$, etc. According to the invention, the modular elements $4_A$, $4_B$, $4_C$, etc. can be arranged in three dimensions in order to form assemblies AS. A plurality of assembly and interconnection elements $BI_A$, $BI_B$, etc. can be used for creating the assemblies AS.

As can be seen more clearly in FIG. 7, the assembly and interconnection elements BI are typically in the form of conductive bars or small plates provided with conductive assembly pins. In the embodiment of FIG. 7, the conductive bar 3 is typically made of copper and comprises a plurality of upper $2_{8H}$ to $2_{11H}$ and lower $2_{8B}$ to $2_{11B}$ conductive assembly pins. The conductive assembly pins are mounted, by means of clamping, in the openings OE of the conductive bar 3. The openings OE have a spacing therebetween that is equal to the pitch P. In this case, the pins are mounted in pairs in the openings OE, an upper pin and a lower pin being inserted into the same opening OE. It will be noted that a pin having a greater length can be used in other embodiments in order to replace the pair of upper and lower pins in one opening OE.

Figure 9:
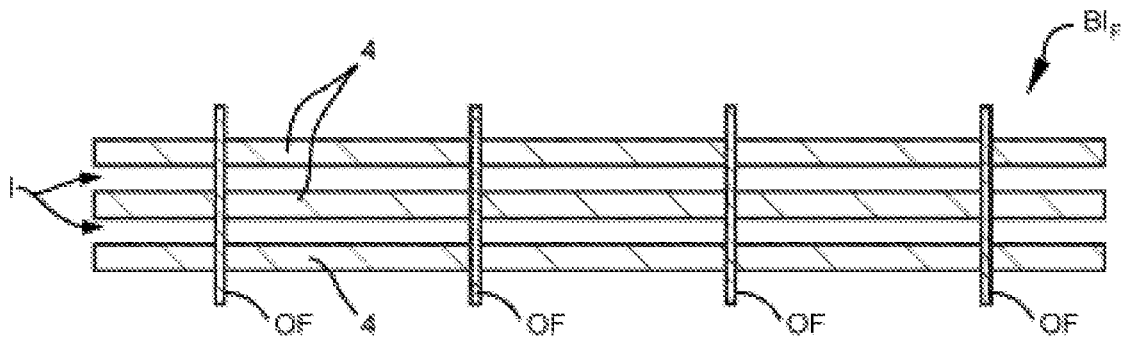
FIG. 9 is a simplified cross-sectional view showing a second embodiment of an assembly and interconnection element that can be used for achieving power switching assemblies.

Other assembly and interconnection elements $BI_F$, such as that shown in FIG. 9, can be used in the assemblies AS in order to provide channels CAN that are typically intended for circulation of a heat-transfer or fire-retardant fluid, or for heat pipes.

In the embodiment of FIG. 9, three conductive bars 4 are stacked and assembled mechanically by means of the pins OF. A spacing is retained between the bars 4, so as to obtain the channels CAN.

The claimed invention is not limited to the particular embodiments that have been described here by way of example. Depending on the applications, a person skilled in the art could make various amendments and variants which are within the scope of the invention.

The invention claimed is:

1. A power switching modular element comprising a lamination of first and second electroconductive plates that are separated by an intermediate dielectric layer, and at least one electronic power switching chip which is implanted between said first and second electroconductive plates, said electronic power switching chip having an upper face comprising a first power electrode and a switching control electrode, and a lower face comprising a second power electrode, and said first and second power electrodes being electrically connected to said first and second electroconductive plates, respectively, wherein said power switching modular element comprises a plurality of openings which extend into said lamination from the outside surfaces of said first and second electroconductive plates and perpendicularly to said outside surfaces, said plurality of openings comprising at least one first opening that communicates with said switching control electrode, and at least one second opening which passes through the entirety of said lamination, said first and second openings each comprising a dielectric layer and an electroconductive layer, and said electroconductive layer of said first opening being electrically connected to said switching control electrode.

2. The power switching modular element according to claim 1, wherein said openings are distributed in a manner having a fixed spacing pitch.

3. The power switching modular element according to claim 1, wherein said power switching modular element comprises two electronic power switching chips which are mounted in parallel, said electronic power switching chips being implanted side-by-side and having the switching control electrodes thereof facing each other, and comprising a first opening that communicates with said switching control electrodes and having an electroconductive layer that is electrically connected to the switching control electrodes.

4. The power switching modular element according to claim 1, wherein said electronic power switching chip is a transistor chip of the vertical type.

5. A disassemblable power switching assembly comprising at least two power switching modular elements according to claim 1 and a plurality of electroconductive assembly pins, wherein said electroconductive assembly pins are received in said openings of said power switching modular elements and ensure mechanical assembly and electrical connection functions between said power switching modular elements.

6. The disassemblable power switching assembly according to claim 5, wherein said two power switching modular elements are arranged top-to-bottom.

7. The disassemblable power switching assembly according to claim 5, wherein said power switching assembly has, on an outside surface of one of said power switching modular elements, accessibility to a plurality of electrical connections with the switching control electrodes of the electronic power switching chips of said power switching modular elements, said plurality of electrical connections being ensured by means of said first openings of said power switching modular elements and said electroconductive assembly pins.

8. The disassemblable power switching assembly according to claim 5, wherein said power switching assembly comprises a fluid circulation channel defined by a space between said power switching modular elements, said space being determined by a spacing between said power switching modular elements obtained by means of said electroconductive assembly pins.

9. The disassemblable power switching assembly according claim 5, wherein said power switching assembly also comprises at least one assembly and interconnection element that is interposed between said power switching modular elements, said assembly and interconnection element comprising at least one electroconductive bar in which a plurality of through-openings are arranged, said through-openings being distributed by said fixed spacing pitch, and receiving said conductive assembly pins.

10. The disassemblable power switching assembly according to claim 9, wherein said assembly and interconnection element comprises at least two electroconductive bars, said electroconductive bars being arranged having a specified mutual spacing, so as to form a fluid circulation channel.

\* \* \* \* \*